(12) United States Patent
Kapur et al.

(10) Patent No.: US 9,082,619 B2
(45) Date of Patent: Jul. 14, 2015

(54) METHODS AND APPARATUSES FOR FORMING SEMICONDUCTOR FILMS

(75) Inventors: Vijay K. Kapur, Tarzana, CA (US); Joel Haber, Pasadena, CA (US); Vincent Kapur, Tarzana, CA (US); Ashish Bansal, Porter Ranch, CA (US); Dan Guevarra, Norwalk, CA (US)

(73) Assignee: International Solar Electric Technology, Inc., Tarzana, CA (US)

( * ) Notice: Subject to any disclaimer, the term of this patent is extended or adjusted under 35 U.S.C. 154(b) by 0 days.

(21) Appl. No.: 13/544,562

(22) Filed: Jul. 9, 2012

(65) Prior Publication Data

US 2014/0011342 A1     Jan. 9, 2014

(51) Int. Cl.
*H01L 21/02*     (2006.01)
*C23C 18/12*     (2006.01)

(52) U.S. Cl.
CPC ...... *H01L 21/02568* (2013.01); *C23C 18/1216* (2013.01); *C23C 18/1241* (2013.01); *C23C 18/1291* (2013.01); *C23C 18/1295* (2013.01); *H01L 21/02614* (2013.01); *H01L 21/02628* (2013.01)

(58) Field of Classification Search
CPC ............ C23C 18/1216; C23C 18/1241; C23C 18/1291; C23C 18/1295; H01L 21/02568; H01L 21/02614; H01L 21/02628
USPC ................. 438/478, 500, 95; 427/248.1, 901, 427/255.23, 372.2, 74, 76, 226; 118/715; 257/E21.09, E21.091, E31.027; 136/264, 265, 262; 106/31.13
See application file for complete search history.

(56) References Cited

U.S. PATENT DOCUMENTS

| 5,728,231 | A | | 3/1998 | Negami et al. |
| 5,910,336 | A | | 6/1999 | Ishihara et al. |
| 6,127,202 | A | * | 10/2000 | Kapur et al. ................... 438/47 |
| 6,127,702 | A | | 10/2000 | Yamazaki et al. |
| 6,268,014 | B1 | | 7/2001 | Eberspacher et al. |
| 6,518,086 | B2 | | 2/2003 | Beck et al. |
| 6,846,558 | B2 | * | 1/2005 | Pham et al. ................... 428/336 |
| 6,875,661 | B2 | | 4/2005 | Mitzi |
| 7,838,403 | B1 | | 11/2010 | Liu et al. |

(Continued)

FOREIGN PATENT DOCUMENTS

| WO | WO 2010/141863 A2 | 12/2010 |
| WO | WO 2012/061023 A1 | 5/2012 |

(Continued)

OTHER PUBLICATIONS

Jimbo et al., "Cu2ZnSnS4-type thin film solar cells using abundant materials", Thin Solid Films, vol. 515, pp. 5997-5999 (2007).*

(Continued)

*Primary Examiner* — Marvin Payen
*Assistant Examiner* — Victor Barzykin
(74) *Attorney, Agent, or Firm* — Wolf, Greenfield & Sacks, P.C.

(57) ABSTRACT

Described herein are systems and methods method for forming semiconductor films. In some embodiment, the methods comprising depositing the source solution containing a solvent and plurality of types of metal ionic species and a second type on a substrate heated to a temperature at or above the boiling point of the solvent. In some embodiments, methods and apparatus for exposing a substrate to a gas are also provided.

15 Claims, 5 Drawing Sheets

(56) References Cited

U.S. PATENT DOCUMENTS

| | | |
|---|---|---|
| 7,915,072 B1 | 3/2011 | Chuang |
| 7,922,804 B2 | 4/2011 | Chuang |
| 7,998,789 B1 | 8/2011 | Chuang |
| 8,000,309 B2 | 8/2011 | Oh et al. |
| 8,038,909 B2 | 10/2011 | Yu et al. |
| 8,048,477 B2 | 11/2011 | Van Duren et al. |
| 8,057,850 B2 | 11/2011 | Curtis et al. |
| 8,088,309 B2 | 1/2012 | Yu et al. |
| 8,097,305 B2 | 1/2012 | Meyer et al. |
| 2001/0003010 A1* | 6/2001 | Pham et al. ............... 427/314 |
| 2005/0006221 A1* | 1/2005 | Takeuchi et al. ........... 204/192.1 |
| 2008/0078325 A1 | 4/2008 | Matsuda et al. |
| 2009/0145482 A1 | 6/2009 | Mitzi et al. |
| 2009/0280624 A1 | 11/2009 | Curtis et al. |
| 2010/0059385 A1 | 3/2010 | Li |
| 2010/0132891 A1 | 6/2010 | Nozawa |
| 2010/0261304 A1 | 10/2010 | Chang et al. |
| 2011/0008927 A1 | 1/2011 | Huang et al. |
| 2011/0139071 A1* | 6/2011 | Oladeji ............... 118/712 |
| 2011/0143048 A1* | 6/2011 | Oladeji ............... 427/529 |
| 2011/0206842 A1* | 8/2011 | Revankar et al. ......... 427/248.1 |
| 2011/0209763 A1 | 9/2011 | Cho et al. |
| 2012/0006687 A1 | 1/2012 | Lee et al. |
| 2012/0080091 A1* | 4/2012 | Min et al. ............... 136/262 |

FOREIGN PATENT DOCUMENTS

| | | |
|---|---|---|
| WO | WO 2012/071288 A1 | 5/2012 |
| WO | WO 2012/071289 A2 | 5/2012 |
| WO | WO 2012/075259 A1 | 6/2012 |
| WO | WO 2012/075267 A1 | 6/2012 |
| WO | WO 2012/075276 A1 | 6/2012 |

OTHER PUBLICATIONS

Thompson, "MOCVD technology for semiconductors", Material Letters, vol. 30, pp. 255-263 (1997).*

Repins et al., "Comparison of Device Performance and Measured Transport Parameters in Widely-Varying Cu(In,Ga)(Se,S) Solar Cells", Prog. Photovolt: Res. Appl., vol. 14, pp. 25-43 (2006).*

Guo et al., Ink formulation and low-temperature incorporation of sodium to yield 12% efficient Cu(In,Ga)(S,Se)2 solar cells from sulfide nanocrystal inks. Progress in Photovoltaics: Research and Applications. May 3, 2012: DOI: 10.1002/pip.2200.

Hibberd, C. J. et al., Non-vacuum methods for formation of Cu(In, Ga)(Se, S) 2 thin film photovoltaic absorbers. Progress in Photovoltaics: Research and Applications. Sep. 2010; 18(6): 434-452.

Oladeji, I. et al., Optimization of Chemical Bath Deposited Cadmium Sulfide Thin Films. J. Electrochem. Soc., Jul. 1997; 144(7):2342-2346.

Todorov, T. et al., Direct liquid coating of chalcopyrite light-absorbing layers for photovoltaic devices. European Journal of Inorganic Chemistry. 2010: 17-28.

Todorov, T. et.al., Solution-processed Cu(In,Ga)(S,Se)2 absorber yielding a 15.2% efficient solar cell. Progress in Photovoltaics: Research and Applications. 2012: DOI: 10.1002/pip.1253.

International Search Report and Written Opinion mailed on Feb. 20, 2014 for PCT/US2013/049781.

\* cited by examiner

METHODS AND APPARATUSES FOR FORMING SEMICONDUCTOR FILMS

FIELD OF THE INVENTION

Described herein are methods and apparatuses for forming semiconductor films on substrates and films formed by the methods and with the apparatuses.

BACKGROUND OF THE INVENTION

In the last decade, the photovoltaic (PV) business has grown at an approximate annual growth rate of greater than 40%. Though the cost of PV generated electricity has come down significantly and is rapidly becoming competitive with conventional means of electricity generation, challenges still lie in further lowering the cost of PV systems. About 50% of the cost of a typical PV system is due to the cost of solar panels that are assembled by connecting a number of solar modules in a desired series or parallel circuit. The remaining 50% cost contribution is due to the balance of the system (BOS) consisting of mounting structures, cables, inverters, permitting and installation.

Currently, wafer based technology of crystalline silicon (c-Si) solar cells dominates the global market with greater than 80% of the market share. However, the cost associated with the production of c-Si modules is an impediment for the production of low-cost solar cells. Thin film solar cell technologies offer the potential of achieving lower manufacturing costs. A generic thin film solar cell typically may include a stack of a number thin films deposited on a substrate, a metallic back contact, a semiconductor absorber layer that effectively absorbs the sunlight, a semiconductor buffer layer that forms a p-n junction, and a transparent conducting oxide (TCO) as the top current collecting layer. In the family of thin film compound solar cells of Group 12-16 (e.g., CdTe), Group 11-13-16 (e.g., $CuInGaSe_2$-CIGS), and Group 11-12-14-16 (e.g., $Cu_2ZnSnS_4$-CZTS) are various absorber layers, CdS, ZnS, CdZnS, ZnSe, $In_2S_3$ are examples of buffer layers and $ZnO, SnO_2$ and ITO (indium tin oxide) are examples of transparent conducting oxide. However, most of the current methods and systems for forming thin film cell solar cells are plagued by one or more challenges, including high production cost, poor efficiencies, complicated manufacturing equipment, etc.

Accordingly, improved methods, systems, and apparatuses are needed.

SUMMARY OF THE INVENTION

In some embodiments, a method for forming a semiconductor film on at least a portion of a substrate comprises (a) depositing a source solution containing a solvent and at least a first type of metal ionic species and a second type of metal ionic species dissolved therein on at least a portion of the substrate to form a preparatory film comprising the first type of metal ionic species and the second type of metal ionic species, wherein the substrate onto which the source solution is deposited is at a temperature at or above the boiling point of the solvent; (b) forming a precursor film by exposing the preparatory film to one or more series of reaction conditions, at least one of the reaction conditions comprising heating the preparatory film; and (c) exposing the precursor film to a material comprising a Group 15 or Group 16 element to form a semiconductor film, wherein the semiconductor film comprises a reaction product formed via a reaction between 1) the Group 15 or Group 16 element and 2) the first type of metal species and/or the second type of metal species. In some embodiments, the one or more series of reaction condition results in the conversion of a substantial portion of the first type of metal ionic species and the second type of metal ionic species into a first type of metal species and a second type of metal species, respectively, wherein the first type of metal species and the second type of metal species each have an oxidation state of zero.

In some embodiments, a method for forming a semiconductor film on at least a portion of a substrate comprises (a) depositing a source solution containing a solvent and at least a first type of metal ionic species and a second type of metal ionic species dissolved therein on at least a portion of the substrate to form a preparatory film comprising the first type of metal ionic species and the second type of metal ionic species, wherein the substrate onto which the source solution is deposited is at a temperature at or above the boiling point of the solvent; and (b) exposing the preparatory film to a material comprising a Group 15 or Group 16 element to form a semiconductor film. In some embodiments, the semiconductor film comprises a reaction product formed via a reaction between 1) the Group 15 or Group 16 element and 2) the first type of metal ionic species and/or the second type of metal ionic species and/or the corresponding metal species.

In some embodiments, a method for forming a film on at least a portion of a substrate comprises depositing a source solution containing a solvent and at least a first type of metal ionic species and a second type of metal ionic species dissolved therein on at least a portion of the substrate to form a preparatory film comprising the first type of metal ionic species and the second type of metal ionic species, wherein the portion of the substrate onto which the source solution is deposited is at a temperature at or above the boiling point of the solvent; wherein the first type of metal ionic species and the second type of metal ionic species are different and are selected from the group consisting of Group 11, Group 12, Group 13 or Group 14 metal ionic species or Group 14 element.

In some embodiments, a method for exposing a substrate to a gas comprises positioning the substrate in a chamber, wherein the chamber comprises a gas inlet, a gas outlet, and a gas supply system associated with the gas inlet, wherein the chamber or the substrate is heated; exposing at least a portion of the substrate to the gas, which comprises a reactive material, via the gas supply system, wherein at least a portion of the gas interacts with the substrate and wherein a portion of the reactive material reacts with the substrate to form a chemically modified substrate and at least one gaseous byproduct; and recirculating the a portion of the gas comprising unreacted reactive material and at least a portion of the gaseous byproduct from the gas outlet back to the gas inlet using a gas treatment and recirculation system, wherein the gas treatment and recirculation system is configured to remove at least a portion of the gaseous byproduct from the gas being recirculated.

In some embodiments, an apparatus for exposing a substrate to a gas comprises a chamber comprising a substrate holder, a gas inlet, and a gas outlet, wherein the substrate holder is configured to be operatively coupled to a substrate; a gas supply system in fluid communication with the gas inlet and configured to supply gas to the chamber and distribute gas onto at least one surface of a substrate associated with the substrate holder; a heater configured to heat the chamber and/or substrate coupled to the substrate holder; and a gas treatment and recirculation system configured to recirculate gas from the gas outlet back to the gas inlet wherein the gas

Other aspects, embodiments, and features of the invention will become apparent from the following detailed description when considered in conjunction with the accompanying drawings. The accompanying figures are schematic and are not intended to be drawn to scale. For purposes of clarity, not every component is labeled in every figure, nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

Described herein are methods and apparatuses for forming a semiconductor film on a substrate. In certain embodiments, the articles formed by the methods comprise or can be modified for use in a thin-film solar cell and/or photovoltaic panel. The subject matter of the present invention involves, in some cases, interrelated products, alternative solutions to a particular problem, and/or a plurality of different uses of one or more systems and/or articles.

In some embodiments, a method for forming a film (e.g., a semiconductor film) on at least a portion of a substrate comprises depositing a source solution containing a solvent and at least a first type of metal ionic species and a second type of metal ionic species dissolved therein, to form a preparatory film comprising the first type of metal ionic species and the second type of metal ionic species. Following deposition of the preparatory film, a precursor film may be formed by exposing the preparatory film to one or more series of reaction conditions, at least one of the reaction conditions comprising heating the preparatory film. In some cases, the one or more series of reaction conditions result in the conversion of a substantial portion of the first type of metal ionic species and the second type of metal ionic species into a first type of metal species and a second type of metal species, respectively, wherein the first type of metal species and the second type of metal species each have an oxidation state of zero. That is, the one or more series of reaction conditions results in the formation of a metal or metal alloy comprising the first type of metal species and the second type of metal species, each having an oxidation state of zero. The precursor film may then be exposed to a material comprising a Group 15 or Group 16 element to form a semiconductor film, wherein the semiconductor film comprises a reaction product formed via a reaction between 1) the Group 15 or Group 16 element and 2) the first type of metal species and/or the second type of metal species. In some embodiments, the first type of metal ionic species and the second type of metal ionic species are different and are selected from the group consisting of Group 11, Group 12, Group 13, or Group 14 metals.

Figure 2:
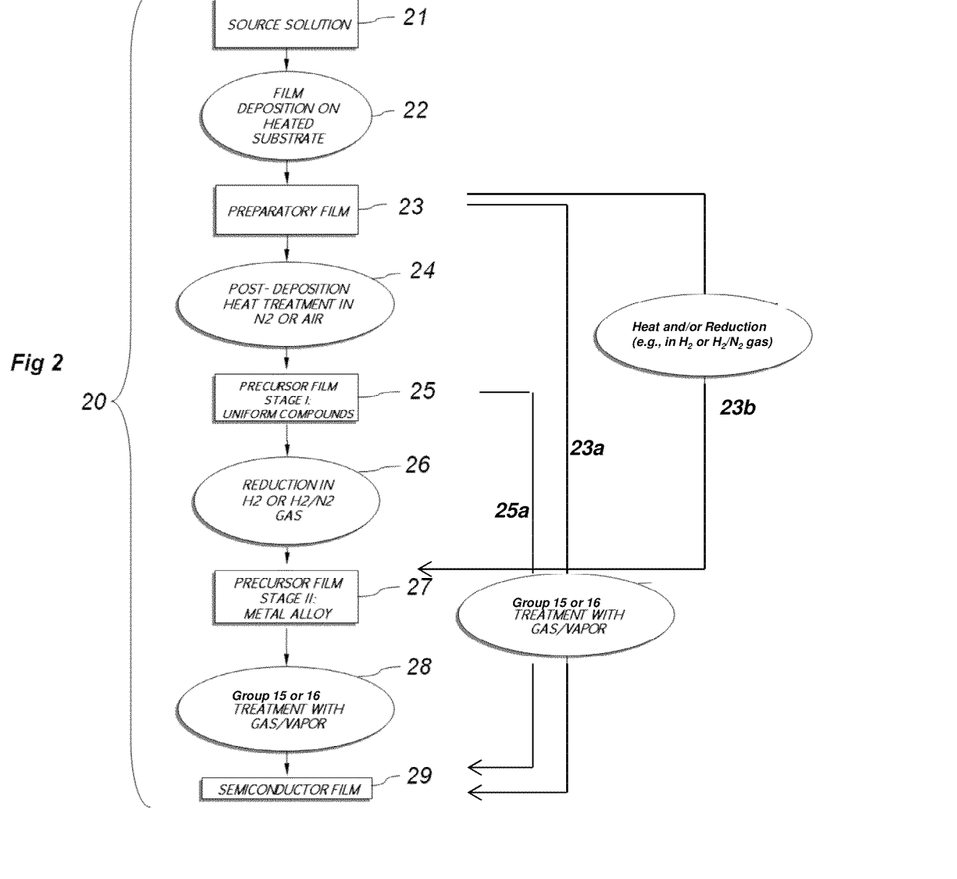
FIG. 2 is a flow chart showing non-limiting steps of a method used to deposit semiconductor films, according to some embodiments.

FIG. 2 provides a schematic representation of a series of non-limiting methods for forming a semiconductor film. Source solution 21 is provided containing a solvent and at least a first type of metal ionic species and a second type of metal ionic species dissolved therein. Source solution is deposited (i.e., 22) on a substrate, for example, wherein the substrate is heated, thereby forming a preparatory film (i.e., 23). Preparatory film 23 may be exposed to one or more series of reaction conditions, at least one of the reaction conditions comprising heating the preparatory film. In a first exemplary embodiment, two different reaction conditions are employed. First reaction conditions 24 comprise heating the preparatory film under an atmosphere of an inert gas (e.g., $N_2$) or air to form stage I precursor film 25. In stage I, a substantial portion of the metal ionic species in the preparatory film may be converted to the related oxides. Second reaction conditions 26 comprise heating the stage I precursor film and exposing the stage I precursor film to a reactive material (e.g., comprising a reducing agent such as $H_2$, optionally provided as $H_2/N_2$), wherein stage II precursor film 27 is formed comprising the metal ionic species in an oxidation state of zero (e.g., as a metal alloy). Stage II precursor film 27 is then exposed to a material comprising a Group 15 or Group 16 element (i.e., 28) to form semiconductor film 29, wherein the semiconductor film comprises a reaction product formed via a reaction between 1) the Group 15 or Group 16 element and 2) the first type of metal species and/or the second type of metal species. FIG. 2 is described in more detail below.

In another exemplary embodiment, one set of reaction conditions are employed. The reaction conditions 24 comprise heating the preparatory film under an atmosphere of an inert gas (i.e., $N_2$) or air to form stage I precursor film 25. Stage I precursor film 25 is then exposed to a material comprising a Group 15 or Group 16 element (i.e., 25a) to form semiconductor film 2. In some embodiments, the semiconductor film comprises a reaction product formed via a reaction between 1) the Group 15 or Group 16 element and 2) the first type of metal ionic species and/or the second type of metal ionic species and/or the corresponding metal species.

In yet another exemplary embodiment, the preparatory film (i.e., 23 in FIG. 2) may be exposed (i.e., 23a in FIG. 2) to a material comprising a Group 15 or Group 16 element to form semiconductor film 29. In some embodiments, the semiconductor film comprises a reaction product formed via a reaction between 1) the Group 15 or Group 16 element and 2) the first type of metal ionic species and/or the second type of metal ionic species and/or the corresponding metal species.

Figure 1:
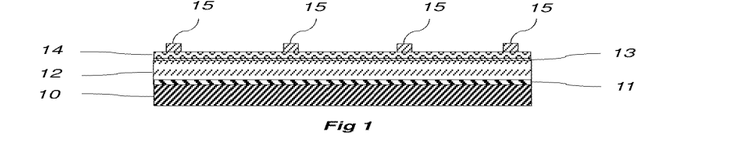
FIG. 1 is a cross-sectional view of solar cell, according to some embodiments.

The semiconductor films formed via the methods described herein may find use in various applications, including, but not limited to, solar cells. Non-limiting examples of solar cells are described herein. In some embodiments, as illustrated in FIG. 1, a solar cell may comprise substrate 10 (e.g., comprising glass, a polymer, a ceramic material, a metallic foil), an absorber layer 12 (e.g., formed using the methods and/or systems described herein), a conductive layer 11 (e.g., comprising molybdenum), a buffer layer 13, a transparent and conducting window layer 14 through which the solar radiation may enter the solar cell, and optionally metallic grid fingers 15. Additional details regarding FIG. 1 are described herein.

In some embodiments, the methods and/or apparatuses described herein may provide advantages as compared to known methods and apparatuses, including, but not limited to, the ease of manufacture, the ability to form a semiconductor film with substantially uniform composition over a large surface area, low cost, and improved efficiencies—compared to typical conventional technologies—of the resulting devices comprising the semiconductor films. The advantages may be attributed, in part, to the methods and apparatuses used for forming the preparatory film which is later converted into the semiconductor film. As described herein, generally, a solution is provided having a plurality of metal ionic species dissolved therein, wherein the plurality of metal ionic species (or chemically modified forms thereof) are to be contained in the final semiconductor film. The solution is deposited on a substrate under conditions so that the resulting composition of the preparatory film contains a substantially uniform distribution of the types of metal ionic species throughout. This substantially uniform distribution of the metal ionic species may facilitate improved working performance of the final semiconductor film (e.g., efficiency). For example, a semiconductor film which is formed from a preparatory film having a substantially uniform composition may have improved properties (e.g., efficiency) as compared to a semiconductor film which is formed from a preparatory film not having a substantially uniform composition.

As is known to those of ordinary skill in the art, different types of metal ionic species generally have different solubilities in various solvents, and thus, typical conventional methods for depositing films comprising multiple types of metal ionic species generally result in substantial non-uniformity in the distribution of the types of metal ionic species in the formed films due to non-uniform precipitation of the metal ionic species from the solution as the solvent is removed after deposition. For example, in many previously described methods, a solution is deposited comprising a first type of metal ionic species and a second type of metal ionic species having a greater solubility in the solvent as compared to the first type of metal ionic species. When the solution is deposited on a substrate in such conventional methods, the solvent can pool non-uniformly on the surface of the substrate and/or may be gradually removed from the surface in a non-uniform fashion. This can lead to the first type of metal ionic species precipitating out of solution at an earlier time point during the solvent removal as compared to the second type of metal ionic species due to solubility differences. This non-simultaneous precipitation of the different types of metal ionic species can result in a greater concentration of the first type of metal ionic species near the surface of the substrate as compared to the second type of metal ionic species, and a greater concentration of the second type of metal ionic species near the free, non-substrate contacting surface of the film as compared to the first type of metal ionic species. Accordingly, the composition of film formed is generally substantially non-uniform across its thickness using traditional method and apparatuses.

In some embodiments, the deposition conditions employed in the methods and apparatuses described herein are selected so that the composition of the resulting film is substantially uniform. That is, the conditions of the deposition of a source solution comprising a plurality of types of metal ionic species may be selected so as to promote the formation of a substantially uniform composition of the preparatory film. In some embodiments, the deposition occurs under conditions such that substantially all of the deposited solvent evaporates upon deposition of the source solution onto at least a portion of the substrate. Those of ordinary skill in the art will be aware of methods and systems for determining the uniformity of the composition of the film. For example, in some embodiments, the uniformity can be determined using x-ray fluorescence (XRF) wherein the amount of each type of metal ionic species may be determined at least in part on the signal.

In some embodiments, the conditions for deposition comprise heating the substrate onto which the source solution is deposited. In some cases, the substrate onto which the source solution is deposited may be heated to and/or maintained at a temperature at or above the boiling point of the solvent. Heating the substrate to a temperature at or about the boiling point of the solvent may reduce the likelihood of the source solution pooling on the surface of the substrate, for example, by promoting rapid evaporation of the solvent. In some embodiments, wherein the solution comprises multiple types of solvent, the substrate may be heated to a temperature at or above the highest boiling point of the various types of solvents present in the solution. In some embodiments, the substrate is heated to a temperature at about 5° C., about 10° C., about 15° C., about 20° C., about 25° C., about 30° C., about 40° C., about 50° C., about 60° C., about 70° C., about 80° C., about 90° C., about 100° C., or greater, above the highest boiling point of the various types solvents present in the solution. In some embodiments, the substrate is heated to a temperature between about 60° C. and about 200° C. Those of ordinary skill in the art will be able to determine an appropriate temperature for the substrate depending on the boiling point of the solvent(s) contained in the solution.

Those of ordinary skill in the art will be aware of suitable methods and systems for heating a substrate and/or a chamber, including, but not limited to radiant heat lamps, laser annealing, plasma arc flash lamps, microwave heating, induction heating, heating coils, and the like.

Various other parameters and conditions of the deposition process may be controlled or varied to promote the rapid and/or substantially complete evaporation of the source solvent(s) upon/shortly after deposition of the source solution onto at least a portion of the substrate (e.g., to help promote the substantially uniform distribution of the types of metal ionic species in the resulting preparatory film). Such parameters and conditions include, but are not limited to, the rate of relative motion between the substrate and the source solution outlet (e.g. spray nozzle), the flow rate of the source solution from the source solution outlet, and the presence or absence of a vacuum or other gas circulation during deposition.

Figure 3A:
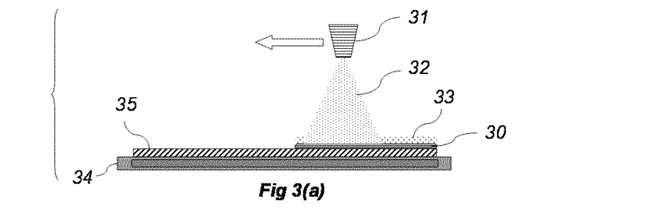
FIG. 3(a) is a schematic representation of spray deposition of a solution on a heated substrate to form a preparatory film, according to some embodiments, when the substrate is kept stationary, while the source solution outlet is being moved.
Figure 3B:
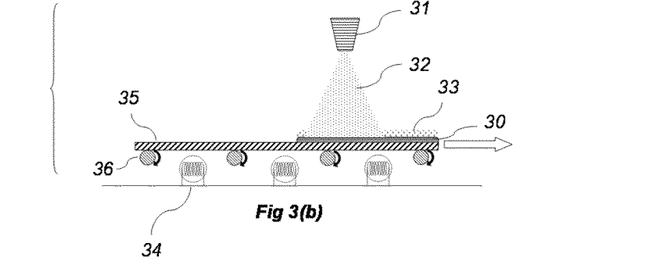
FIG. 3(b) is a schematic representation of spray deposition of a solution on a heated substrate to form a preparatory film, according to some embodiments, when the source solution outlet is kept stationary, while the substrate is being moved.

In some embodiments the source solution is deposited on the surface of the substrate from an outlet that is movable relative to the surface. For example, as shown in FIG. 3a, and as described in more detail below, substrate 30 may be kept stationary and a source solution outlet (e.g., ultrasonic nozzle) 31 may be moved relative to the substrate. Alternatively, as shown in FIG. 3b, and as described in more detail below, source solution outlet (e.g., ultrasonic nozzle) 31 may remain stationary and substrate 30 may be moved relative to the source solution outlet. In yet other embodiments, both the substrate and the solution are movable. The rate of motion may be adjusted so as to promote or ensure rapid evaporation of the solvent. In some cases, the substrate is moved at a rate of about 0.25 ft/min, about 0.5 ft/min, about 0.75 ft/min, about 1 ft/min, about 2 ft/min, about 3 ft/min, about 5 ft/min, about 10 ft/min, about 20 ft/min, about 30 ft/min, about 40 ft/min, about 50 ft/min, about 60 ft/min, about 70 ft/min, about 80 ft/min, about 90 ft/min, about 100 ft/min, or greater, or any range therein, relative to the solution outlet, or vice versa. In some cases, the substrate is moved at a rate between about 0.25 ft/min and about 100 ft/min The source solution may be provided from the source solution outlet at any suitable flow rate. Non-limiting examples of flow rates include about 0 5 mL/min, about 1 mL/min, about 5 mL/min, about 10 mL/min, about 25 mL/min, about 50 mL/min, about 75 mL/min, about 100 mL/min, about 200 mL/min, about 300 mL/min, about 400 mL/min, about 500 mL/min, or greater. In some embodiments, the flow rate is between about 1 mL/min and about 500 mL/min Those of ordinary skill in the art will be able to adjust the deposition conditions so that pooling of the solution is avoided and/or so that the solvent evaporates substantially within a desired period of time, e.g., essentially immediately upon deposition. In some cases, the conditions are selected so that solvent evaporates substantially immediately upon deposition of the source solution on the substrate. A person of ordinary skill in the art will be able to determine whether the conditions of deposition are such that pooling is avoided and/or so that the solvent evaporates substantially immediately upon deposition. In some cases, this may be determined by one of ordinary skill in the art via visual inspection. For example, the flow rate of the source solution from the source solution outlet, the relative motion of the substrate versus the source solution outlet, and/or the temperature of the substrate onto which the source solution is deposited may be adjusted so that by visual inspection, no pooling or wetness is observed within about 0.25 cm, about 0.5 cm, about 0.75 cm, about 1 cm, about 1.25 cm, about 1.5 cm, about 1.75 cm, about 2 cm, about 3 cm, about 4 cm, about 5 cm, or about 10 cm, of the source solution outlet at about 0.25 seconds, about 0.5 seconds, about 0.75 seconds, but one second, about 1.25 seconds, about 1.5 seconds, but 1.75 seconds, about 2 seconds, about 3 seconds, about 4 seconds, about 5 seconds, about 10 seconds, following deposition of the source solution on the substrate. If pooling and/or non-rapid/instantaneous solvent evaporation is observed, one or more of the various deposition parameters discussed herein may be adjusted to reduce and/or eliminate the pooling and/or facilitate rapid or essentially immediate evaporation. For example, in certain cases this may be accomplished by one or more of the following adjustments: increasing the relative motion between the substrate and the source outlet, reducing the flow rate of the source solution from the nozzle, and/or increasing the temperature of substrate.

Those of ordinary skill in the art will be aware of suitable methods and systems for depositing the source solution containing a solvent and at least a first type of metal ionic species and a second type of metal ionic species dissolved therein, on at least a portion of the substrate. Non-limiting examples of techniques include spraying—such as ultrasonic spraying, electrostatic spraying, air assisted spraying, airless spraying, inkjet printing, roller coating, curtain coating, Meyer bar coating, and slot die coating. As will be understood by those of ordinary skill in the art, the choice of the deposition technique may depend upon the degree of control that the technique offers in maintaining the uniformity of the deposited coating. In some cases, the size of the nozzle (e.g., employed in spray techniques) may be selected so as to cover a small portion of the substrate at once, or may cover a larger portion or the full width the substrate at once. Spray nozzles and techniques useful to practice the methods disclosed herein will be known to those of ordinary skill in the art and are commercially available, for example, Ultrasonic Systems Inc, Prism 300.

The source solution may be deposited on and/or the preparatory film may be formed on any portion of the substrate. In some embodiments, the portion of the substrate comprises substantially all of one side of the substrate. In some embodiments, the portion of the substrate comprises a portion of one side of the substrate.

In some embodiments, the source solution may further comprise additional types of metal ionic species, for example, a third type of metal ionic species, a fourth type of metal ionic species, etc. In some embodiments, the source solution further comprises a third type of metal ionic species. In such embodiments, during the exposing step, a portion or all of the third type of metal ionic species may be converted into a third type of metal species, wherein the third type of metal species has an oxidation state of zero. Furthermore, in some embodiments, the semiconductor film may comprise a reaction product formed via reaction between a Group 15 or Group 16 element and a first type of metal species, a second type of metal species, and/or a third, fourth, etc. type of metal species. Those of ordinary skill in the art will be able to apply these teachings to source solutions comprising more than three types of metal ionic species Suitable metal ionic species for use as the first type of metal ionic species, the second type of metal ionic species, the third type of metal ionic species, etc. are known. Non-limiting examples of metal ionic species include Group 11, Group 12, or Group 13 metals, or Group 14 metals or elements. As used herein, these Groups are defined according to IUPAC-accepted nomenclature as is known to those of ordinary skill in the art. In some embodiments, the first type of metal ionic species comprises a Group 11 metal and the second type of metal ionic species comprises a Group 13 metal. In some cases, the Group 11 metal is selected from the group consisting of Cu and Ag. In some cases, the Group 12 metal is selected from the group consisting of Zn and Cd. In some cases, the Group 13 metal is selected from the group consisting of Al, Ga, and In. In some cases, the Group 14 metal or element is selected from the group consisting of Sn, Si, and Ge. In some cases, the first type of metal species is Cu. In some cases, the second type of metal species is In. In some cases, the third type of metal species is Ga. In some cases, the metal ionic species are Cu, In, and Ga, or Cu, Zn, and Sn.

The selection of the types of metal ionic species may be based upon the desired combination of types of metal atom containing species contained in the final semiconductor film (e.g., the reaction product). Those of ordinary skill in the art will be able to select suitable combinations of metal species and materials comprising a Group 15 or Group 16 element to form a selected reaction product. In some embodiments, the reaction product comprises a Group 11-13-16 composition. In some embodiments, the reaction product comprises the formula $CuIn_{1-x}Ga_xSe_{2-y}S_y$, where $0 \leq x \leq 1$ and $0 \leq y \leq 2$. In such embodiments, the metal ionic species in the source solution may be Cu, In, and Ga. In some embodiments, the reaction product comprises $CuInGaSe_2$, $CuInGaS_2$. In other embodiments, the reaction product comprises a Group 11-12-14-16 composition. In some embodiments, the reaction product comprises the formula $Cu_2ZnSnS_4$. In such embodiments, the metal ionic species in the source solution may be Cu, Zn, and Sn.

In some embodiments, the source solution and/or the reaction product may further comprise a dopant. The dopant may be present in the preparatory or the precursor film by providing the dopant to the source solution. In some embodiments, the dopant is provided in the solution, and the preparatory film comprises the dopant. Non-limiting examples of dopants include lithium (Li), sodium (Na), potassium (K), phosphorous (P), arsenic (As), antimony (Sb), bismuth (Bi), iron (Fe), and/or zinc (Zn). In some embodiments, the dopant may be selected and/or present so as to enhance and/or modify the electronic properties of the semiconductor material.

Generally, the ratio of the metal ionic species provided in the source solution is selected based upon the desired ratio of the types of metal ionic species in the preparatory film, the precursor film, and/or the semiconductor film (e.g. comprising the reaction product). In exemplary embodiments wherein the source solution comprises a first type of metal ionic species and a second type of metal ionic species, the ratio of the first type of metal ionic species to the second type of metal ionic species may be about 0.7:1, about 0.75:1, about 0.8:1, about 0.85:1, about 0.87:1, about 0.90:1, about 0.92:1, about 0.95:1, about 0.97:1, about 1:1, about 1.1:1, or about 1.2:1. In embodiments wherein more than two types of metal ionic species are provided, the ratio of types of metal ionic species may be based upon the group in which each type of metal ionic species is selected. For example, in an exemplary embodiment where the first type of metal ionic species is a Group 11 metal (e.g., Cu) and the second type and third type of metal ionic species are Group 13 metals (e.g., Ga and In), the ratio of the Group 11 metal to the Group 13 metals may be about 0.7:1, about 0.75:1, about 0.8:1, about 0.85:1, about 0.87:1, about 0.90:1, about 0.92:1, about 0.95:1, about 0.97:1, about 1:1, about 1.1:1, or about 1.2:1. In exemplary embodiments, the relative ratio of metal ionic species of Group 13 (e.g. Ga/(In+Ga)) may be about 0.05:1, about 0.1:1, 0.15:1, about 0.2:1, about 0.25:1, about 0.28:1, about 0.30:1, about 0.35:1, about 0.40:1.

Those of ordinary skill in the art will be able to select suitable solvents for use with the methods and apparatuses described herein using the guidance provided herein. In some embodiments the solvent comprises more than one type of solvent. Non-limiting examples of solvents include water, methanol, ethanol, benzene, p-cresol, toluene, xylene, mesitylene, diethyl ether, glycol, petroleum ether, hexane, cyclohexane, pentane, dichloromethane (or methylene chloride), chloroform, carbon disulfide, carbon tetrachloride, dioxane, tetrahydrofuran (THF), dimethyl sulfoxide, dimethylformamide, hexamethyl-phosphoric triamide, ethyl acetate, pyridine, triethylamine, picoline, or combinations thereof. In some embodiments, the solvent comprises water. In some embodiments, the solvent comprises water and an alcohol. Non-limiting examples of alcohols include methanol, ethanol, propanol, and butanol. In some embodiments, the solvent comprises water and methanol.

In some embodiments, the solvent may be selected so that the metal ionic species are soluble in the solvent. In some embodiments, the metal ionic species may have a solubility in the solvent greater than about 10 mg/L, greater than about 20 mg/L, greater than about 50 mg/L, greater than about 100 mg/L, greater than about 200 mg/L, greater than about 500 mg/L greater than about 1 g/L, greater than about 2 g/L, greater than about 5 g/L, greater than about 10 g/L, greater than about 20 g/L, greater than about 50 g/L, greater than about 100 g/L, greater than about 200 g/L, or greater. In all cases, the source solution is homogenous with no dispersed, suspended, or undissolved solids.

The metal ionic species or sources/precursors thereof for use with the methods and apparatus described herein are generally known and commercially available. In some embodiments, the metal ionic species is provided as a compound, wherein the compound is soluble in the solvent. In some embodiments, a metal ionic species is provided as a nitrate, a nitrite, a halide, a sulfate, a sulfite, a citrate, an acetate, an acetylacetonate, or the like. In some embodiments, the counter ion may be selected so that the counter ions do not substantially interfere with the preparation of the preparatory film and/or semiconductor film using the methods or systems described herein.

Appropriate substrates and substrate materials for use with the methods and apparatus described herein are generally known and commercially available. The substrate may be non-conductive, partially conductive, or substantially conductive. In some embodiments, the substrate comprises more than one material, for example, a first layer comprising a non-conductive material and a second layer comprising a conductive material, wherein the preparatory film may be formed on at least a portion of the conductive material, the non-conductive material, or both. Non-limiting examples of non-conductive substrate materials include inorganic substrates, (e.g., quartz, glass, ceramics, etc.), polymeric substrates (e.g., polyimide, polyethylene terephthalate, polyethylene naphthalate, polycarbonate, polystyrene, polypropylene, etc.). Non-limiting examples of conductive substrate materials include indium tin oxide (ITO), fluorine tin oxide (FTO), antimony-doped tin oxide (ATO), aluminum-doped zinc oxide (AZO), glassy carbon, carbon mesh, metal oxides and other metal compounds (e.g., platinum oxide, nickel oxide, nickel phosphide, zinc oxide, tin oxide, vanadium oxide, zinc-tin oxide, indium oxide, indium-zinc oxide, titanium boride, cadmium stannate, zinc stannate), graphite, and metals or metal alloys (e.g., comprising molybdenum, tantalum, titanium, gold, nickel, copper, silver, platinum, ruthenium, rhodium, osmium, iridium, nickel, cadmium, tin, chromium, aluminum, cobalt, zinc, vanadium, nickel, palladium, or combinations thereof)

The substrate may be of any size or shape. Non-limiting examples of shapes include sheets, cubes, cylinders, hollow tubes, spheres, and the like. In some embodiments, the substrate is substantially planar. In some embodiments, the maximum dimension of the substrate in one dimension is at least about 1 mm, at least about 1 cm, at least about 5 cm, at least about 10 cm, at least about 1 m, at least about 2 m, or greater. In some embodiments, the minimum dimension of the substrate in one dimension is less than about 200 cm, less than about 100 cm, less than about 50 cm, less than about 30 cm, less than about 10 cm, less than about 5 cm, less than about 1 cm, less than about 1 mm, less than about 0.01 mm, less than 0.001mm, less than about 1 μm (micrometer), less than about 100 nm, or less. In some embodiments, the substrate has an area of about 0.001 $cm^2$, or about 0.01 $cm^2$, or about 0.05 $cm^2$, or about 0.1 $cm^2$, or about 0.5 $cm^2$, or about 1 $cm^2$, or about 2 $cm^2$, or about 5 $cm^2$, or about 10 $cm^2$, or about 20 $cm^2$, or about 25 $cm^2$, or about 50 $cm^2$, or about 75 $cm^2$, or about 100 $cm^2$, or about 150 $cm^2$, or about 200 $cm^2$, or about 300 $cm^2$, or about 400 cm², or about 500 cm² or about 1000 cm², or about 5000 cm², or about 10,000 cm², or about 20,000 cm².

The preparatory film comprising deposited metal ionic species may have any suitable thickness. In some embodiments, the preparatory film may have substantially uniform thickness (e.g., wherein the thickness of the preparatory film does not vary more than 10%, or more than 5%, or more than 1% over the surface of the substrate). In exemplary embodiments, the preparatory film may have substantially uniform thickness and the thickness may be between about 0.1 um and about 50 um, between about 0.1 um and about 25 um, between about 0.1 um and about 10 um, between about 0.1 um and about 5 um, between about 1 um and about 5 um, between about 1 um and about 3 um, between about 0.5 um and about 2 um, about or between about 1 um and about 2 um. In some embodiments, the thickness of the preparatory film may be about 0.05 um, about 0.1 um, about 0.5 um, about 1 um, about 1.5 um, about 2 um, about 3 um, about 5 um, about 10 um, about 15 um, about 20 um, about 25 um, about 50 um, or greater. The precursor films (e.g., stage I or stage II precursor films) and/or the semiconductor films may also have a thickness as described above. Those of ordinary skill in the art will be aware of methods and techniques for determining the thickness of the film.

Following deposition of the preparatory film, the preparatory film may be exposed to one or more of a series of conditions to form a precursor film comprising the metal ionic species, each having an oxidation state of zero. In some embodiments, a first set of reaction conditions (i.e., 24 in FIG. 2) may comprise heating the preparatory film, thereby forming a stage I precursor film (i.e., 25 in FIG. 2). Heating the preparatory film may aid the decomposition of some or all metal compounds present and/or promote the formation of stage I precursor film. In some cases, the heat treatment may aid in converting the metal ionic species into a composition comprising metal oxides with optional dopants. In some cases, the preparatory film may be heated under a flow of an inert gas (e.g., $N_2$) or air. In some embodiments, the preparatory film is heated to a temperature of about 100 °C., about 200 °C., about 300 °C., about 400 °C., about 500 °C., about 600 °C., about 700 °C., or more, optionally under an inert gas. The preparatory film may be heated for any suitable period of time, for example, about 1 min., about 5 min., about 10 min., about 15 min., about 20 min., about 25, about 30 min., about 45 min., about 60 min., about 90 min., about two hours, about three hours, four hours, five hours, about six hours, about 12 hours, or more. In some cases, the preparatory film is heated for a period of time required to convert a substantial portion of the metal ionic species contained in the preparatory film into the related metal oxides.

In some embodiments, a preparatory film or stage I precursor film may be exposed to a set of reaction conditions, wherein a substantial portion of the first type of metal ionic species and the second, third, etc. type of metal ionic species are converted into a first type of metal species and a second, third, etc. type of metal species, respectively, wherein each of the metal species has an oxidation state of zero. That is, the preparatory film or the stage I precursor film is exposed to reaction conditions, thereby forming a metal or metal alloy comprising the first type of metal species and the second, third, etc. type of metal species, each having an oxidation state of zero (i.e., a stage II precursor film; 27 in FIG. 2). For example, in some cases, the formed precursor film may be a stage II precursor film (i.e., 27 in FIG. 2) formed by exposing a stage I precursor film (i.e., 25 in FIG. 2) to a second set of reaction conditions (i.e., 26 in FIG. 2) or by exposing a preparatory film (i.e., 23 in FIG. 2) to a set of reaction conditions (i.e., 23b in FIG. 2). In some embodiments, the reaction conditions comprise heating and/or exposing the preparatory film or the stage I precursor film to a reactive material. In some embodiments, the reactive material is a reducing agent. In some embodiments, the reactive material is a gas. Accordingly, for example, the preparatory film or stage I precursor film may be heated while being exposed to a reducing agent, wherein the metal ionic species are converted into the corresponding metal species. Non-limiting examples of reducing agents include $H_2$, CO, $CH_4$, and carbon. In some embodiments, a byproduct is produced during conversion of the preparatory film to a precursor film (e.g., a stage II precursor film) or during conversion of the stage I precursor film to a stage II precursor film. In some cases, the byproduct is water (e.g., formed via the reduction of metal oxides in the presence of $H_2$). In some embodiments, the byproduct may be gaseous under the conditions of the exposure (e.g., gaseous water at elevated temperatures and/or reduced pressures).

In some embodiments, the preparatory film or stage I precursor film is heated under an atmosphere between about 50 Torr and about 760 Torr, or at about 50 Torr, about 100 Torr, about 200 Torr, about 300 Torr, about 400 Torr, about 500 Torr, about 600 Torr, or about 700 Torr. In some embodiments, the preparatory film is heated to a temperature of about 100° C., about 200° C., about 300° C., about 400° C., about 500° C., about 600° C., about 700° C., about 800° C., about 900° C., about 1000° C., or more, optionally under a flow of an inert gas. The preparatory film or stage I precursor film may be heated for any suitable period of time, for example, about 1 min., about 5 min., about 10 min., about 15 min., about 20 min., about 25, about 30 min., about 45 min., about 60 min., about 90 min., about two hours, about three hours, four hours, five hours, about six hours, about 12 hours, or more. In some cases, the preparatory film or stage I precursor film is heated for a period of time required to convert a substantial portion of the metal ionic species into the corresponding metal species having an oxidation state of zero.

In some embodiments, a gas comprising reactive material is passed over a substrate, which comprises a preparatory film or stage I precursor film comprising a metal ionic species, in a chamber and a portion of the reactive material reacts with the preparatory film (or stage I precursor film). Any remaining gas, including any unreacted reactive material and/or any gaseous byproducts may be removed from the chamber via an outlet. In some embodiments, however, the gas from the outlet is recirculated to the inlet, and in some such cases the byproducts are substantially removed from the gas prior to recirculating the gas back to the inlet.

Accordingly, in some embodiments, a method for exposing a substrate to a gas comprises positioning the substrate (e.g., comprising a preparatory film or stage I precursor film) in a chamber, wherein the chamber comprises a gas inlet, a gas outlet, and a gas supply system (e.g., proximate the surface comprising the preparatory film) associated with the gas inlet, and wherein the chamber and/or the substrate is heated. At least a portion of the substrate may be exposed to the gas, which comprises a reactive material, via the gas supply system, wherein at least a portion of the gas interacts with the substrate (e.g., the preparatory film or a stage I precursor film) and wherein a portion of the reactive material reacts with the substrate to form a chemically modified substrate (e.g., to form a precursor film or a stage II precursor film) and at least one gaseous byproduct (e.g., water). A portion of the gas comprising unreacted reactive material and at least a portion of the gaseous byproduct may be recirculated from the gas outlet back to the gas inlet using a gas treatment and recirculation system, wherein the gas treatment and recirculation system is configured to remove at least a portion of the gaseous byproduct from the gas being recirculated.

Figure 5:
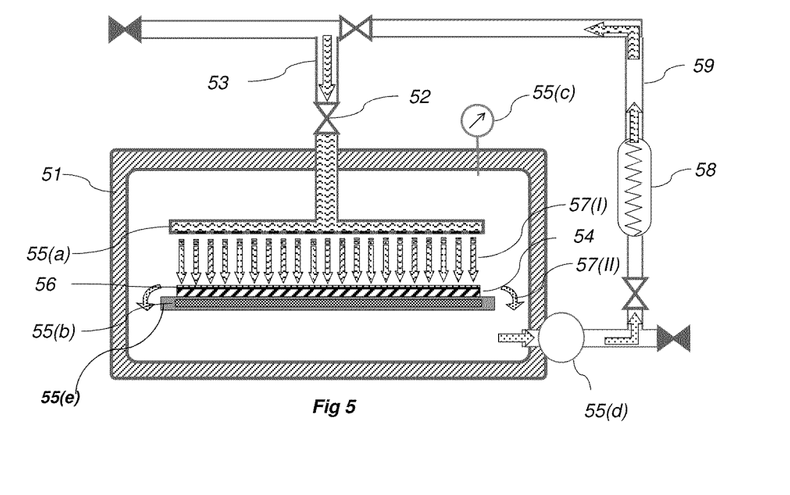
FIG. 5 is a schematic representation of a system for heat treatment of a preparatory film under a controlled atmosphere $H_2$ or its mixture with $N_2$ gas to form a precursor film comprising a metal or metal alloy of substantially uniform composition, according to some embodiments.

A non-limiting example of an apparatus for carrying out the above described method is shown in FIG. 5. In some embodiments, an apparatus for exposing a substrate to a gas is provided comprising a chamber (i.e., 51 in FIG. 5), comprising a substrate holder (i.e., 55(e) in FIG. 5), a gas inlet (i.e., 52 in FIG. 5), and a gas outlet (i.e., 55(d) in FIG. 5), wherein the substrate holder is configured to be operatively coupled to a substrate; a gas distribution system (i.e., 55(a) in FIG. 5), associated with the gas inlet, optionally positioned adjacent to the substrate holder, and configured to distribute gas onto at least one surface of a substrate associated with the substrate holder; a heater (i.e., 55(b) in FIG. 5) configured to heat the chamber and/or a substrate coupled to the substrate holder; and a gas handling system (i.e. 58, 59, and 53 in FIG. 5), configured to circulate gas from the gas outlet to the gas inlet wherein the gas handling system comprises a moisture removal system configured to remove moisture from the gas being circulated. In some embodiments, the apparatus further comprises a temperature system configured to display and/or adjust the temperature of the apparatus (i.e., 55(c) in FIG. 5). In some embodiments, the apparatus further comprises a vacuum pressure system configured to display and/or adjust the pressure of the apparatus (i.e., 55(c) in FIG. 5). In some embodiments, the apparatus further comprises a substrate comprising a preparatory film or stage I precursor film comprising a first type of metal ionic species and a second type of metal ionic species (i.e., 56 in FIG. 5).

FIG. 5 illustrates a non-limiting apparatus comprising substrate 54 (i.e., comprising preparatory film or stage I precursor film 56) placed in chamber 51. Substrate 54 may be heated (i.e., via heater 55(b)), and gas distribution system 55(a) (e.g., shower head or a gas distribution nozzle) may be optionally positioned adjacent to the substrate and oriented to impinge gas upon the substrate. The chamber may optionally be evacuated (e.g., using vacuum). A gaseous reactant (e.g., $H_2$) may be provided via inlet 52 associated with gas distribution system 55(a) and the gaseous reactant (i.e., 57(I)) may be flowed over substrate 54, wherein a portion of the gaseous reactant may react with the preparatory film or stage I precursor film and byproducts may be formed. Any unreacted gas comprising the byproducts and the unreacted reactive material (i.e., gaseous stream 57(II)) may be collected via outlet 55(d) and recirculated to inlet 52 via a gas handling system (i.e., comprising 58, 59, and 53), wherein the gas handling system is configured to circulate gas from the gas outlet to the gas inlet and to remove a portion of the gaseous byproduct. For example, in embodiments wherein the gaseous byproduct is water, the gas handling system may comprise a moisture removal system (i.e., 58) configured to remove moisture from the gas being circulated. Those of ordinary skill in the art will be aware of suitable systems for removing a gaseous byproduct from the system. For example, in embodiments where the gaseous byproduct is water, the system may comprise a cold trap, or a column comprising a moisture absorbing material. Additional details regarding FIG. 5 are described below.

In some embodiments, the precursor film (or stage II precursor film) formed from exposing the preparatory film (or stage I precursor film) to a recycled gas stream comprising a reactive material may be of better or essentially the same quality as a film prepared not using recycled gas. However, in such cases the reactive material usage may be reduced by at least about or about 10%, at least about or about 20%, at least about or about 30%, at least about or about 40%, at least about or about 50%, at least about or about 60%, at least about or about 70%, at least about or about 80%, at least about or about 90%, at least about or about 95%, at least about or about 98%, or more.

In some embodiments, a preparatory film may be exposed to a material comprising a Group 15 or Group 16 element to form a semiconductor film. In some embodiments, the semiconductor film comprises a reaction product formed via a reaction between the Group 15 or Group 16 element and the metal species (and/or optionally any of several types of metal ionic species or the corresponding metal species).

In some embodiments, following the formation of a precursor film from a preparatory film (e.g. stage I precursor film or stage II comprising a metal alloy), the precursor film may then be exposed to a material comprising a Group 15 or Group 16 element to form a semiconductor film. In some embodiments, the semiconductor film comprises a reaction product formed via a reaction between the Group 15 or Group 16 element and the metal species (or optionally any of several types of metal species present or corresponding metal ionic species). For example, in some embodiments, a stage I precursor film may be exposed to a material comprising a Group 15 or Group 16 element to form a semiconductor film, wherein the semiconductor film comprises a reaction product formed via a reaction between the Group 15 or Group 16 element with metal ionic species, for example, wherein metal ionic species are not reduced to an oxidation state of zero prior to exposure to the Group 15 or Group 16 element. As another example, in other embodiments, a stage II precursor film may be exposed to a material comprising a Group 15 or Group 16 element to form a semiconductor film, wherein the semiconductor film comprises a reaction product formed via a reaction between the Group 15 or Group 16 element with metal species each having an oxidation state of zero. The semiconductor film may optionally comprise dopants, as described herein. Non-limiting examples of reaction products are described herein, for example, $CuInGaSe_2$, $CuInGaS_2$, and $Cu_2ZnSnS_4$.

Those of ordinary skill in the art will be aware of suitable materials comprising a Group 15 or Group 16 element for use in the methods described herein. In some embodiments, the material is provided as a gas. In some embodiments, the Group 15 element is selected from the group consisting of P, As, and Sb or the Group 16 element is selected from the group consisting of S, Se, and Te. In some embodiments, the Group 16 element is S. In some embodiments, the Group 16 element is Se. In some embodiments, the material comprising a Group 15 or Group 16 element is selected from the group consisting of $AsH_3$, $SbH_3$, $PH_3$, $H_2S$, $H_2Se$, vapors of S, vapors of Se, and vapors of Te.

Those of ordinary skill in the art will be aware of methods and systems for exposing a preparatory film or precursor film to a material comprising a Group 15 or Group 16 element, for example, as described herein and as described in U.S. Pat. No. 6,127,202 by Kapur et al., herein incorporated by reference.

In some cases, the efficiency of a solar cell comprising a semiconductor material formed using the methods or apparatus described herein may be about 5%, about 6%, about 7%, about 8%, about 9%, about 10%, about 11%, about 12%, about 13%, about 14%, about 15%, about 16%, about 17%, about 18%, about 19%, about 20%, or greater. Those of ordinary skill in the art will be aware of conditions for determining the efficiency of a solar cell. For example, in some embodiments, the efficiency of the solar cell may be measured under standard test conditions (STC) of air mass 1.5 (AM1.5) spectrum, an irradiance of 1000 W/m² and at a temperature of 25° C. In some cases, the solar cell for determining the efficiency of the device is as described in FIG. 1.

The following examples and embodiments are included to demonstrate various features of the invention. Those of ordinary skill in the art, in light of the present disclosure, will appreciate that many changes can be made in the specific embodiments which are disclosed while still obtaining a like or similar result without departing from the scope of the invention as defined by the appended claims. Accordingly, the following examples and embodiments are intended only to illustrate certain features of the present invention, but do not necessarily exemplify the full scope of the invention. Furthermore, while the following examples focus on semiconductor materials comprising Group 11-13-16 materials, this is by no means limiting, and those of ordinary skill in the art will be able to apply the teachings to other types of semiconductor materials.

EXAMPLES AND EMBODIMENTS

A non-limiting example of a structure of a solar cell comprising a Group 11-13-16 semiconductor material made in accordance with the methods and systems described herein is shown in FIG. 1. The solar cell is fabricated on a substrate that comprises of a sub-layer 10, which may typically comprise a non-conductive material (e.g., a glass, a polymer, a ceramic, or a metallic foil). An absorber layer 12 may be deposited on a conductive layer 11, comprising of molybdenum (Mo), which may act as the back ohmic contact to the solar cell. The sub-layer 10 and a coating 11 may together be regarded as the substrate for deposition of the semiconductor preparatory films. A buffer layer 13 may be deposited on the absorber layer 12 to form a p-n junction. A transparent and conducting window layer 14 through which the solar radiation may enter the solar cell, may be deposited on top of the buffer layer 13. This completes the fabrication of a solar cell, however, in some cases may be deposited metallic grid fingers 15 on top of the window layer 14 to aid in collecting the photo-generated current efficiently.

The conductive layer 11 may be an electrically conducting material like Mo which provides a good ohmic contact to the Group 11-13-16 semiconductor absorber layer 12. Other non-limiting materials include W, Ta, Ti, Au, and Ni. The conductive layer 11, may comprise a composite of two layers of materials. The conductive layer 11 may not be needed if the sub-layer 10 is itself a conductive material and/or can provide good ohmic contact to the semiconductor absorber layer 12.

As noted above, in some cases the Group 11-13-16 semiconductor material (e.g., an absorber layer, optionally a p-type absorber layer) 12 may be represented by the general formula $CuIn_{1-x}Ga_xSe_{2-y}S_y$, where $0 \leq x \leq 1$ and $0 \leq y \leq 2$, this group of compounds may also represented by the general chemical formula $Cu(In,Ga)(Se,S)_2$.

The absorber layer 12 of the Group 11-13-16 may be deposited as described herein and/or may be selected from the group comprising ternary and higher order of selenide, sulfides and tellurides of copper (Cu), silver (Ag), aluminum (Al), indium (In), gallium (Ga), and their alloys as well as, optionally, other materials described herein. One exemplary material of the absorber layer 12 is $CuIn_{1-x}Ga_xSe_{2-y}S_y$, where $0 \leq x \leq 1$ and $0 \leq y \leq 2$. This layer may additionally contain dopants such as lithium (Li), sodium (Na), potassium (K), phosphorous (P), arsenic (As), antimony (Sb), bismuth (Bi), iron (Fe) and zinc (Zn) which may enhance or modify the electronic properties of the absorber layer 12.

The buffer layer 13 may comprise of a semiconductor material with a bandgap greater than that of the absorber layer 12. Non-limiting commonly used buffer layers include CdS, Cd(Zn)S, ZnS, $Zn(OH)_xS_y$, ZnSe and sulfides and selenides of indium ($In_2S_3$) and gallium ($Ga_2S_3$). This layer may be deposited, for example, by chemical bath deposition (CBD) methods or atomic layer deposition (ALD) methods (e.g., for depositing $In_2S_3$ or $Ga_2S_3$ buffer layer).

Layer 14 may comprise transparent conducting oxides (TCO) (e.g., like ZnO, Zn-Stannate, Indium Tin Oxide (ITO) and Tin oxide). Non-limiting commonly used techniques for depositing TCO layers are sputtering, low pressure chemical vapor deposition (LPCVD), and solution coating techniques.

The finger pattern 15 may be deposited on top of the TCO window layer 14, for example, to reduce the series resistance introduced by the window layer 14. In a module structure that employs narrow cells, a finger pattern may not be required. However, as the cell width increases, finger pattern may become important. Finger patterns can be applied using commonly known techniques including evaporation, electroplating and screen printing or inkjet printing of conducting inks. In another approach the finger pattern may be obtained by bonding conducting wires of appropriate size. Additionally an anti-reflecting coating (not shown in the FIG. 1) may also be deposited over window layer 14, for example, to further improve the efficiency of the finished solar cells.

FIG. 2 shows non-limiting steps of a solution process 21 for depositing compound semiconductor films (e.g., in the family of chalcopyrites and chalcogenides including oxides, sulfides, selenides and tellurides) according to a specific embodiment.

To obtain the desired electronic properties, in the final Group 11-13-16 semiconductor film, the source solution 21 may be prepared by dissolving appropriate amounts of metal compounds in a suitable solvent or mixtures of solvents to obtain a desired and fixed Group 11:13 ratio before deposition. This fixed composition may be maintained in the preparatory film 23, in the precursor film 25 in stage I, in the precursor film 27 in stage II, and finally in the semiconductor film 29.

The starting source solution 21 may be deposited in a film deposition step 22 onto a heated substrate of choice, to obtain the preparatory film 23. Depending upon the chemistry of materials in the preparatory film 23, it may be advantageous to further process this film thermally. A heat treatment of the preparatory film 23 in the process step 24, may be carried out under an inert atmosphere of flowing $N_2$/Ar gas, or under an atmosphere of flowing clean air, or under vacuum resulting in the formation of the precursor film 25 (Stage I) of substantially uniform composition. Most commonly, the precursor film 25 comprises oxides of metals in Groups 11 and 13.

The precursor film 25 may then be chemically reduced in the process step 26 to obtain a precursor film 27 (stage II) comprising metals and their alloys of a fixed Group 11:13 ratio. During the process step 26, the chemical reaction may generate a liquid phase of metal alloys that can result in the formation of a uniform and a continuous precursor film 27.

Process step 28 can involve the chalcogenization of the precursor film 27 via a chemical reaction with a gas or a vapor phase material containing Group 16 element. A semiconductor film 29 of substantially uniform and controlled composition may be obtained as a result of the chalcogenization process step 28.

With reference to FIG. 2, the starting source solution 21 may comprise a stable substantially homogeneous solution of compounds of the desired metallic components. The selection of compounds may depend on their solubility in the chosen solvent or mixture of solvents. Commonly used compounds include, but are not limited to, nitrates, halides, acetylacetonates, acetates and other suitable compounds that have reasonable solubility in the solvent(s) of choice.

The source solution 21 may be prepared by dissolving the chosen compounds in quantities required to obtain the fixed Group 11:13 metal ratio (e.g., 0.8-1.0 range). The compounds of various metals can have common or different anions so long as they can dissolve in the solvent of choice. For the solar cells made with chalcopyrites absorbers of the Group 11-13-16, sodium and other alkali metals may be used as dopants to improve the solar cell performance. Alkali metal compounds may be dissolved in source solution 21 in the desired amount of dopants required, along with the compounds of metals of Groups 11 and 13. Thus the source solution may provide the fixed composition with a desired Group 11:13 ratio and with the desired amount of dopants needed.

With reference to FIG. 2 deposition of the source solution 21 onto a heated substrate may be carried out in a process step 22.

FIG. 3 illustrates the deposition of the source solution 21 using an ultrasonic spray method. In FIG. 3a the spray deposition may be carried out with substrate 30 kept stationary and ultrasonic head 31 (e.g., Ultrasonic Systems Inc, Prism 300) moving with a preprogrammed motion to obtain a film 33 of substantially uniform composition. The substrate 30 may be placed on a flat heater 34 that sits on a stable platen 35. The temperature of the substrate may be maintained in the range of 60° C.-200° C. to assist the evaporation of the solvent(s) used for preparing the source solution 21. The ultrasonic head 31 generates a fine mist 32 from the source solution 21, which on landing onto the heated substrate dries and loses its solvent by evaporation without creating a pool of source solution and is able to deposit the dissolved compounds in the form of a solid film 33 of substantially uniform composition.

As described herein, the conditions may be controlled so that essentially no pooling of the source solution is observed when it is deposited on the surface of the substrate. If a pool of the source solution is formed, as the solvent evaporates, the metal compound that has the highest solubility in the solvent will tend to concentrate in the drying pool and precipitate out the metal compound with the least solubility, thus creating compositional non-uniformity in the solid film.

Alternatively, in FIG. 3b, the ultrasonic head 31 stays stationary and substrate 30 sitting on a stable platen 35 moves according to a preprogrammed motion carried out by the moving mechanism 36. The stable platen 35 may be heated (e.g., with radiant heat lamps 34.) In both arrangements, a solid film 33 may be obtained with a substantially uniform composition. This solid film 33 corresponds to the preparatory film 23 in FIG. 2.

With reference to FIG. 3, ultrasonic spray deposition of source solution 21 is illustrated. In a non-limiting example, the sprayed composition comprises a Group 11 is metal ionic species that comprises Cu, and the Group 13 metal ionic species comprises In and Ga. The metal compounds in the source solution 21 may be the nitrates of Cu, In and Ga dissolved in a mixture of methanol and water. Deposition of source solution 21 on heated substrate 30 using ultrasonic spray method illustrated in FIG. 3a, results in a solid film 33 on the substrate. This film 33 (an embodiment of preparatory film produced by step 23 of FIG. 2) comprises a mixture of metal nitrates and some oxides (e.g., due to partial decomposition of the metal nitrates). The film 33 may be further processed through a post deposition heat treatment in process step 24 under a flowing atmosphere of $N_2$ gas as shown in FIG. 4 to obtain a precursor film 25 as described in FIG. 2, which comprises an intimate and substantially uniform mixture of oxides of Cu, In and Ga.

Figure 4:
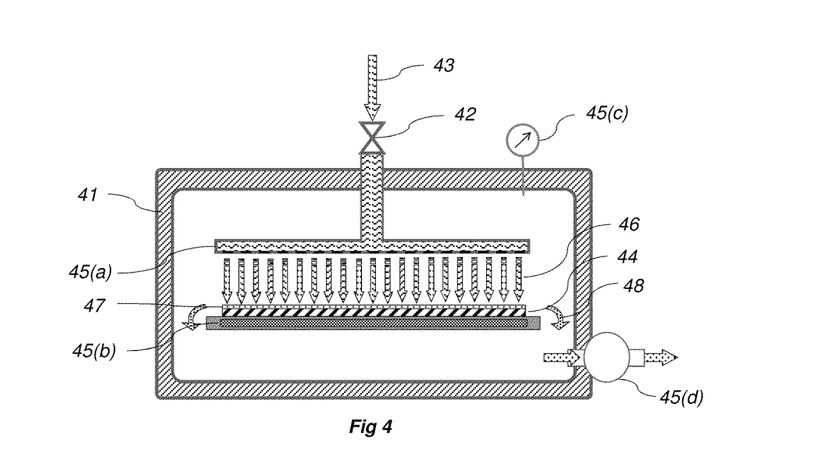
FIG. 4 is a schematic representation of a system for heat treatment of a preparatory film under an atmosphere of $N_2$/air or vacuum to form a preparatory film comprising a mixture of oxides with substantially uniform composition, according to some embodiments.

FIG. 4 diagrammatically illustrates a set-up for a post deposition heat treatment for the preparatory film 23. Chamber 41 is designed to withstand vacuum processing and has a gas inlet valve 42 through which a desired gas 43 can be introduced into the chamber through a gas distribution system or a showerhead 45(a). Chamber 41 has a built in heater 45(b), a pressure/vacuum gauge 45 (c) and is also fitted with a gas outlet and vacuum valve 45(d). Substrate 44 with a preparatory film 23 on it is heated in this chamber by the heater 45(b) in the temperature range of 300° C.-400° C. under a uniformly distributed stream of flowing $N_2$ gas 46 to remove the decomposition products 48 of metal nitrates. This post deposition heat treatment decomposes the metal nitrates to result in the oxide precursor film 47 which corresponds to the precursor film 25 in FIG. 2.

Figure 4A:
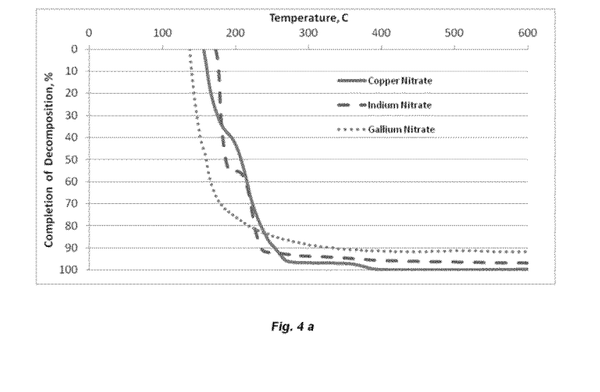
FIG. 4(a) shows data for the decomposition of nitrates of Cu, In, and Ga, according to some embodiments.

FIG. 4(a) shows differential thermal gravimetric traces for the decomposition of nitrates of Cu, In and Ga. The decomposition of nitrates Cu, In and Ga resulted in the formation their respective oxides. With an error bar about 7-10% in the weight measurement, the decomposition of nitrates was completed before 400° C. Thus the post deposition heat treatment close to 400° C. indicates that substantially all of the nitrates were converted to oxides, resulting in the precursor film 25 in (stage I) as described in FIG. 2.

FIG. 5 schematically describes a set-up for the process step 26 (FIG. 2) in which the chemical reduction of the precursor film 25 may be carried out with $H_2$ or its mixture with $N_2$ gas. Chamber 51 is designed to withstand vacuum processing, has a gas distribution system or a showerhead 55(a), a built in heater 55(b), a vacuum/pressure gauge 55(c) and is also fitted with a gas outlet or a vacuum valve 55(d). The substrate 54 coated with a precursor film 25 may be heated in the temperature range 300° C.-600° C. by the heater 55 (b). The gas stream 53 entering the chamber through an inlet valve 52 may be substantially uniformly distributed by the shower head 55 (a) to form a flowing and reducing gas stream 57(i), which may be allowed to react with an oxide in precursor film 25 on the substrate 54. In the case of a glass substrate, the upper limit of the reaction temperature may be limited by the softening point of glass, however when the substrate is a metallic foil or a ceramic substrate that can withstand higher temperature, the maximum temperature for the reduction reaction can be elevated to up to 1000° C. The gas pressure in the chamber can range from 100-760 Torr depending on the reactor design. The exiting gas stream 57(ii) comprises of un-reacted $H_2/N_2$ mixed with water vapor as the reaction byproduct. To keep the gaseous consumption low the exiting gas stream may be passed through a moisture removal system 58 and the dried gas stream recycled through a recycling loop 59 through which the dried gas stream is mixed with the inlet gas stream 53. After reduction the precursor film may be converted into a substantially uniform film 56 comprising metals Cu, In, and Ga, or their alloys.

The reduction process may also be carried out with hydrogen plasma and other reducing gases such as carbon monoxide (CO) and methane ($CH_4$). Heating of the substrate can be also be achieved by, for example, laser annealing, plasma arc flash lamps, microwave or induction heating.

In this embodiment, the oxide precursor film 25 may be reduced to metal Cu, In, and Ga and since at the reaction temperature, usually 500° C.-550° C., both In and Ga metals form eutectics with Cu, the resulting precursor film 56 which corresponds to the precursor film 27 in FIG. 2, is a shining metallic film comprising metals and their alloys. These alloy phases include, but are not limited to CuIn, $CuIn_2$, $Cu_{11}In_9$, $Cu_{16}In$, $Cu_9In_4$, $CuGa_2$, $Cu_9Ga_2$, and other alloys thereof.

Figure 6:
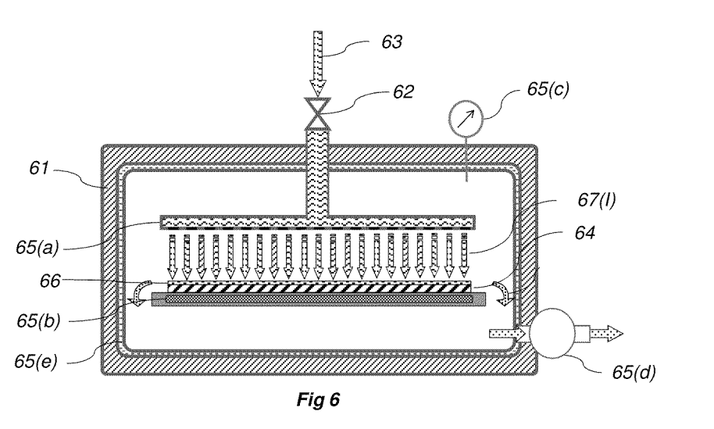
FIG. 6 is a schematic representation of a system for heat treatment of a precursor film under a controlled atmosphere gases or vapors (e.g., Group 16 gases or vapors) to form a semiconductor film, according to some embodiments.

FIG. 6 schematically describes a set-up for an exemplary process step 28 (FIG. 2) in which chalcogenization of the precursor film 27 which is a metallic film comprising metals Cu, In, Ga and their alloys in a fixed Group 11:13 ratio, may be carried out by reacting it with a gas or vapor containing Group 16 element. Chamber 61 designed to withstand vacuum processing, has a gas distribution system or a showerhead 65(*a*), a built in heater 65(*b*), a vacuum/pressure gauge 65(*c*) and is also fitted with a gas outlet or a vacuum valve 65(*d*). The substrate 64 coated with a precursor film 27 may be heated in the temperature range 300 ° C. -600 ° C. by the heater 65 (*b*). The incoming gas 63 entering the chamber through an inlet valve 62 may be uniformly distributed by the shower head 65(*a*) to form a substantially uniform gas stream 67(I) containing Group 16 element(s), which may be allowed to react with the metallic precursor film 27 on the substrate 64 to form the semiconductor film 66 of substantially uniform and desired composition. The semiconductor film 66 corresponds to the semiconductor film 29 in FIG. 2. In some embodiments, the gas stream may comprise $H_2Se$ or $H_2S$ gases, both of which are corrosive gases and can attack the chamber 61. To avoid any damage to the chamber 61, a protective coating 65(e) may be coated onto the inside of the chamber 61. The coating 65(*e*) may comprise ceramic, glass or a corrosion resistant alloy that can withstand chemical reaction from either $H_2Se$ or $H_2S$ gases.

Example 1

Fabrication of CIGS Solar Cells

A source solution (shown as 21 in FIG. 2) was prepared by fixing the Cu/(In+Ga) ratio at 0.90 and Ga/(In+Ga) ratio at 0.20 by dissolving nitrates of Cu, In, and Ga in a mixed solvent comprising 66% methanol ($CH_3OH$) and 34% water ($H_2O$). Sodium nitrate was dissolved as a dopant required for improved electronic properties of CIGS absorber layer.

An aliquot of about 13.5 ml of the source solution was sprayed with precision onto a heated Mo coated glass substrate (such as shown at 10 and 11 in FIG. 1) using an ultrasonic spray machine (e.g., Ultrasonic Systems Inc., Prism 300) that generated a fine mist of the source solution with a pre-programmed schedule. The delivery of the source solution was adjusted such that on arriving at the heated substrate, maintained at 175° C., the solvent of the source solution evaporated without creating a pool. This aided in avoiding any unwanted compositional non-uniformity due to segregation of the dissolved nitrates due to the difference in the respective solubilities in the mixed solvents. At the substrate temperature of 175° C. besides the solvent evaporation, there is some decomposition of the dissolved metal nitrates. The spraying process resulted in the preparatory film (shown as 23 in FIG. 2) of thickness about 1.7-1.9 μm. This glass substrate with a preparatory film on it was placed inside a chamber as shown in FIG. 4 and the substrate was heated to 375° C. to decompose metal nitrates into their respective oxides. A stream of $N_2$ gas was flowed over the surface of the preparatory film to remove the oxides of nitrogen produced as a result of decomposition of metal nitrates.

The differential thermal gravimetry (DTG) data shown in FIG. 4*a* indicates that the thermal decomposition of nitrates of Cu, In and Ga is completed at 375° C. Thus the heat treatment resulted in the formation of metal oxides as the precursor film in stage I (shown as 25 in FIG. 2).

The glass substrate with the precursor film 25 on it was then placed in a chamber similar to the one shown in FIG. 5 and $H_2$ gas was delivered across the surface of the precursor film 25. The chamber was first evacuated to remove any air and then filled with flowing $H_2$ gas while the substrate was heated to 520° C. in 30 minutes and kept there for another 30 minutes to reduce the metal oxides. A metallic looking and shinning precursor film in stage II (shown as 27 in FIG. 2) comprising of alloys of Cu, In, and Ga and possibly some elemental Indium, was obtained. The chamber was cooled carefully without causing any breakage of glass substrate.

In order to keep the consumption of $H_2$ gas low, an alternate approach described in FIG. 5 was also employed. The exit gas stream containing unreacted $H_2$ gas and water vapor as a byproduct of the reduction of metal oxides, was passed through a cold trap 58 in FIG. 5, to remove moisture and the dried gas stream exiting the cold trap was recycled through the chamber for oxide reduction. The quality of the precursor film 27 obtained in this manner was equally good or slightly better than in the non-recycled flowing gas case. However, the volume of $H_2$ gas used was $1/20^{th}$ of the volume used in the non-recycled flowing gas set-up.

The glass substrate with the precursor film 27 on it was placed in a selenization chamber, similar to the one shown in FIG. 6. After evacuation, the chamber lined with a protective coating, was filled at room temperature with a mixture of $H_2Se$ and $N_2$ gases containing 3.25% of $H_2Se$ gas. The substrate was heated to 450° C. and kept there for 30 minutes after which it was heated further to raise its temperature to 550° C. and kept there for additional 10 minutes before cooling it at a rate 15° C. per minute. The selenization process resulted in the formation of about 1.5 μm thick CIGS film 29 (shown in FIG. 2) of substantially uniform composition. The thickness uniformity of the semiconductor film was determined by measuring the X-Ray Fluorescence (XRF) signal from the copper atoms in the film. The average signal of copper counts per second (cps) observed for 12 uniformly distributed data points was 11.5±0.4. The compositional uniformity of the semiconductor film was also determined by measuring the X-Ray Fluorescence (XRF) signal from the copper, indium and gallium atoms in the film. The ratio of Cu/(In+Ga) signals observed for 12 uniformly distributed data points was 2.59±0.09 (i.e., an empirical XRF signal ratio, and not necessarily the molar/atomic ratio of the metallic species in the film).

To evaluate the electronic quality, the CIGS semiconductor film 29 thus obtained was used to fabricate a solar cell by depositing a buffer layer of CdZnS of thickness 0.06 μm using the commonly used chemical bath deposition method (e.g., see Vora, N., Repins, I., Robbins, S., Mann, J., Castenada, H., Armstrong, B., and Weber, D., Large Area Chemical Bath Deposition on CdS on Cu(In,Ga)$Se_2$, Mater Res. Soc. Symp. Proc. Vol 1165, 2009, 1165-M05-05, herein incorporated by reference) After the deposition of the buffer layer, a layer of transparent and conducting ZnO layer of thickness 1.8 μm was deposited using low pressure chemical vapor deposition (LPCVD) method (e.g., see Fay, S., Shah, A., Zinc Oxide Grown by CVD Process as Transparent Contact for Thin Film Solar Cell Applications, Chapter 6, Page 235, Transparent Conductive Zinc Oxide, ed. Ellmer, K., Klein, A., and Rech, B, herein incorporated by reference). Boron doped ZnO layer was deposited using diethyl zinc and water vapor as reactants. The sheet resistance of the ZnO layer was in the 8-12 ohms per square.

Figure 7:
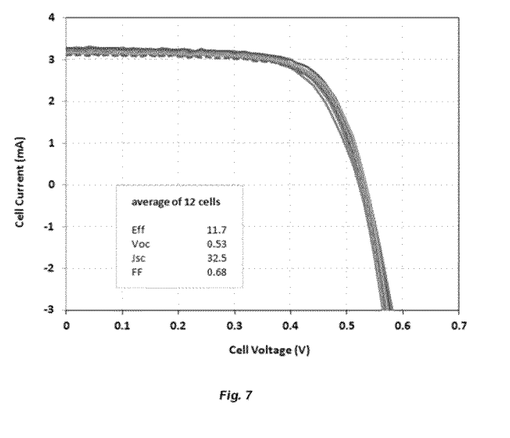
FIG. 7 illustrates the uniformity of the process in a cluster of illuminated current-voltage curved (I-V curves) of a number of solar cells fabricated with an absorber $Cu_{0.9}In_{0.8}Ga_{0.2}Se_2$ film grown according to some embodiments.

On a 10×10 $cm^2$ substrate, a number of small area (0.1 $cm^2$) solar cells fabricated using the methods of described herein, were isolated and measured under a simulated light source. FIG. 7 shows measurements of 12 such cells and their illuminated I-V curves with 11.7% conversion efficiency. The key issue highlighted by the set of these super-imposed current-voltage curves (I-V curves) is the ability of the solution process in depositing CIGS layer with a high degree of compositional uniformity.

Example 2

Fabrication of a Monolithically Integrated CIGS Module

Figure 8:
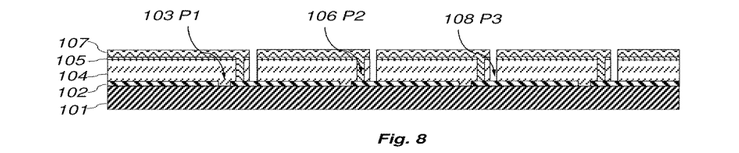
FIG. 8 is a schematic of a monolithically integrated CIGS module, according to some embodiments.

FIG. 8 schematically shows a monolithically integrated CIGS modules fabricated on a glass substrate, with a number of solar cells connected in series to obtain the desired voltage. On a 10 cm×30 cm glass substrate 101, a module was designed to connect twenty five (25) cells in series. To achieve this, the Mo back contact layer 102 was scribed at 103P1 by laser twenty four (24) times to create twenty five (25) isolated Mo pads. On this patterned glass/Mo substrate, CIGS absorber layer 104 was deposited in as described herein. To fabricate solar cells, a buffer layer of CdZnS 105 was deposited on the surface of the CIGS layer 104 using a chemical bath deposition method. For making the interconnections, twenty four (24) openings 106P2 were created with a mechanical scribe to expose the surface of the Mo back contact through the stacked layers of CIGS/CdZnS. A transparent and conducting ZnO layer 107 was deposited using LPCVD method. This conducting layer connected the top of a cell (−ve) to the back of the adjacent cell (+ve). Finally to complete the series circuit, the ZnO layer 107 was isolated at 108P3 twenty four (24) times using a mechanical scribe.

Figure 9:
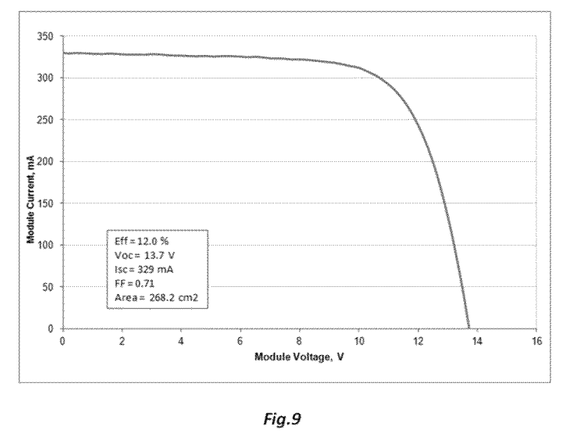
FIG. 9 illustrates an illuminated I-V curve of a monolithically integrated CIGS module, according to some embodiments.

FIG. 9 shows the I-V characteristic of the CIGS module with an aperture area (268.2 cm$^2$) efficiency of 12%. The electrical characteristics of this module with twenty five (25) cells connected in series are, open circuit voltage of 13.7 V, short circuit current 0.329 mA and fill factor of 71%.

Achieving 12% efficiency in a module of area 268.2 cm$^2$ indicates the applicability of this approach to large area processing. This can be applied with proper spraying or other coating tools to manufacture large area (1.0 M$^2$) modules with very good control on maintaining the composition of the CIGS absorber layer.

The basic approach described here can be applied to manufacturing both large area (60.0×120.0 cm$^2$) solar modules and for small area customized modules. The composition control and the uniformity in the film composition can result in high process yields. By selecting equipment that delivers precisely and efficiently the source solution on the desired substrate, high materials utilization can be realized. Both high process yield and high materials' utilization can help lower the cost of manufacturing CIGS solar cells.

While several embodiments of the present invention have been described and illustrated herein, those of ordinary skill in the art will readily envision a variety of other means or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A solar cell comprising a semiconductor film, wherein the semiconductor film is formed by a method comprising the steps:
   (a) depositing a source solution via a source solution outlet, wherein the source solution contains a solvent and at least a first type of metal ionic species a second type of metal ionic species dissolved therein on at least a portion of the substrate to form a preparatory film comprising the first type of metal ionic species and the second type of metal ionic species, wherein the substrate onto which the source solution is deposited is at a temperature at or above the boiling point of the solvent, wherein the solvent evaporates substantially immediately upon deposition of the source solution onto the substrate, and wherein the preparatory film has substantially uniform composition;
   (b) heating the preparatory film to form a stage I precursor film, wherein the heating is conducted under an atmosphere of an inert gas or air, thereby converting a substantial portion of the metal ionic species contained in the preparatory film into the related metal oxides;
   (c) heating the stage I precursor film under an atmosphere between about 50 Torr and about 760 Torr and exposing the stage I precursor film to recirculated and dried $H_2$ gas to form a stage II precursor film, wherein the stage II precursor film comprises an alloy comprising the first type of metal species and the second type of metal species, each having an oxidation state of zero; and
   (d) exposing the stage II precursor film to a material comprising a Group 15 or Group 16 element gas or vapor to form a semiconductor film, wherein the semiconductor film comprises a reaction product formed via a reaction between 1) the Group 15 or Group 16 element and 2) the first type of metal species and/or the second type of metal species,
   wherein the solar cell has an efficiency of at least about 10%.

2. The solar cell of claim 1, wherein the source solution further comprises a third type of metal ionic species, wherein the preparatory film comprises the first type of metal ionic species, the second type of metal ionic species, and the third type of metal ionic species, optionally wherein the third type of metal ionic species is selected from the group consisting of Group 11 metals, Group 12 metals, Group 13 metals, or Group 14 metals or elements.

3. The solar cell of claim 2, wherein during step (c), a substantial portion of the third type of metal ionic species are converted into a third type of metal species, wherein the third type of metal species has an oxidation state of zero.

4. The solar cell of claim 3, wherein the semiconductor film comprises a reaction product formed via a reaction between 1) either the Group 15 or Group 16 element and 2) the first type of metal species, the second type of metal species, or a third type of metal species.

5. The solar cell of claim 1, wherein the depositing step occurs under conditions such that the solvent substantially completely evaporates upon deposition of the source solution on the substrate.

6. The solar cell of claim 1, wherein the first type of metal ionic species and the second type of metal ionic species is selected from the group consisting of Group 11 metals, Group 12 metals, Group 13 metals, or Group 14 metals or elements.

7. The solar cell of claim 6, wherein the Group 11 metal is selected from the group consisting of Cu and Ag.

8. The solar cellffiethed of claim 6, wherein the Group 12 metal is selected from the group consisting of Zn and Cd.

9. The solar cell of claim 6, wherein the Group 13 metal is selected from the group consisting of Al, Ga, and In.

10. The solar cell of claim 6, wherein the Group 14 metal or element is selected from the group consisting of Sn, Si, and Ge.

11. The solar cell of claim 1, wherein the Group 15 element is selected from the group consisting of P, As, and Sb or the Group 16 element is selected from the group consisting of S, Se, and Te.

12. The solar cell of claim 1, wherein the material comprising a Group 15 or Group 16 element is provided as a gas.

13. The solar cell of claim 1, wherein the reaction product comprises $CuInGaSe_2$ or $CuInGaS_2$.

14. The solar cell of claim 1, wherein no pooling or wetness is observed within about 5 cm of the source solution outlet at about 5 seconds following deposition of the source solution on the substrate.

15. The solar cell of claim 1, wherein the heating the stage I precursor film is conducted under vacuum conditions.

* * * * *

UNITED STATES PATENT AND TRADEMARK OFFICE
CERTIFICATE OF CORRECTION

PATENT NO. : 9,082,619 B2  
APPLICATION NO. : 13/544562  
DATED : July 14, 2015  
INVENTOR(S) : Kapur et al.

Page 1 of 1

It is certified that error appears in the above-identified patent and that said Letters Patent is hereby corrected as shown below:

In the Specification:

Column 7, line 21, insert a -- . -- at the end of the sentence.

Column 7, line 24, delete "flow rates include about 0 5 mL/min, about 1 mL/min, about" insert -- flow rates include about 0.5 mL/min, about 1 mL/min, about --.

Column 7, line 29, insert a -- . -- at the end of the sentence.

In the Claims:

Column 23, claim 1, line 34, delete "Group 16element" insert -- Group 16 element --.

Column 24, claim 4, line 11, delete "Group 16element" insert -- Group 16 element --.

Column 24, claim 6, line 20, delete "Group 11metals" insert -- Group 11 metals --.

Column 24, claim 8, line 24, delete "cellffiethed" insert -- cell --.

Signed and Sealed this  
Twenty-second Day of December, 2015

Michelle K. Lee  
*Director of the United States Patent and Trademark Office*